(12) United States Patent  (10) Patent No.: US 8,791,744 B2
Takimoto et al.  (45) Date of Patent: Jul. 29, 2014

(54) SEMICONDUCTOR SWITCHING SYSTEM

(75) Inventors: Kazuyasu Takimoto, Tokyo (JP);
Hiromichi Tai, Tokyo (JP); Hiroshi Mochikawa, Tokyo (JP); Akihisa Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/026,619

(22) Filed: Feb. 14, 2011

(65) Prior Publication Data
US 2011/0309874 A1    Dec. 22, 2011

(30) Foreign Application Priority Data

Jun. 22, 2010 (JP) ................. 2010-141732

(51) Int. Cl.
*H03K 17/687* (2006.01)
*H03K 17/06* (2006.01)
(52) U.S. Cl.
CPC .................. *H03K 17/063* (2013.01)
USPC .......................................... 327/427
(58) Field of Classification Search
USPC ................. 327/427, 432, 433, 434, 436, 437
See application file for complete search history.

(56) References Cited

U.S. PATENT DOCUMENTS 5,910,892 A * 6/1999 Lyons et al. ............. 363/98

FOREIGN PATENT DOCUMENTS

| CN | 101632214 A | 1/2010 |
|---|---|---|
| JP | 2006-141167 | 6/2006 |
| JP | 2006-141168 | 6/2006 |
| JP | 2008-193839 | 8/2008 |
| JP | 2008193839 | 8/2008 |
| KR | 20090096745 | 9/2009 |

OTHER PUBLICATIONS

Korean Intellectual Property Office Office Action dated Aug. 27, 2012.
Official Action issued by the Chinese Patent Office in Chinese Patent Application No. 201110175092.3, action dated Aug. 28, 2013, 12 pages (with translation).

* cited by examiner

*Primary Examiner* — Sibin Chen
(74) *Attorney, Agent, or Firm* — Baker Botts L.L.P.

(57) ABSTRACT

According to one embodiment, a semiconductor switch includes a first element that includes a switching element and an anti-parallel diode. The switching element has a breakdown voltage and is coupled to a control terminal and second and third terminals. The semiconductor switch further includes a second element having a breakdown voltage lower than that of the first element. The second element is coupled to a control terminal and second and third terminals. The semiconductor switch also includes a flyback diode having a breakdown voltage substantially similar to that of the first element. A negative electrode of the first element is connected to a negative electrode of the second element and the flyback diode is connected in parallel between a positive terminal of the first element and a positive terminal of the second element. The control terminal for the first element and the control terminal for the second element are coupled to one or more control circuits independently of each other.

7 Claims, 13 Drawing Sheets

CURRENT FLOWING DIRECTION

SEMICONDUCTOR SWITCHING SYSTEM

CROSS-REFERENCE TO RELATED APPLICATIONS

This application is based upon and claims the benefit of priority from Japanese Patent Application(s) No. 2010141732, filed on Jun. 22, 2010, the entire contents of which are incorporated herein by reference.

FIELD

Embodiments described herein relate generally to electrical devices.

BACKGROUND

As one example of conventional power conversion circuits in which a freewheeling diode is connected anti-parallel to a switching element of a main circuit, there is known a power conversion circuit in which a semiconductor switch corresponding to one arm of a bridge circuit is configured by serially connecting an auxiliary element and a main element, which are respectively formed of a voltage-driven switching element and an anti-parallel diode. Further, a high-speed freewheeling diode with a withstanding voltage equivalent to that of the main element is connected anti-parallel to the serial connection of the main element and the auxiliary element.

In such a power conversion circuit as noted above, respective main elements of the upper and lower arms of the bridge circuit are supplied with an off-signal and come into a gate-off state if a device is abnormally stopped due to such causes as a load current becoming too high or a device temperature increasing to a specified value or more. At this time, the auxiliary element is also continuously supplied with the off-signal in synchronism with the main element. This makes it difficult to feed an electric current to the auxiliary element of the respective arms. Thus, a main current continues to flow through the high-speed freewheeling diode. The current flowing in the gate-off state shows a sharp increase in its average value as compared with a normal operation in which an electric current flows only during a time interval between the off-time of one semiconductor switch and the on-time of the other semiconductor switch in a single-phase equivalent bridge circuit, i.e., during the dead time interval. This is accompanied by a significant increase in the loss, i.e., the amount of heat generated in the high-speed freewheeling diode. Therefore, a problem is posed in that the high-speed freewheeling diode requires a stricter cooling design. Although a SiC diode is attracting attention as one example of high-speed diodes in recent years, the SiC diode remains expensive. Accordingly, there is a need for a low-withstanding voltage low-capacity SiC diode and a circuit implementation including the same that can be realized with a relatively low price.

DETAILED DESCRIPTION

Figure 1:
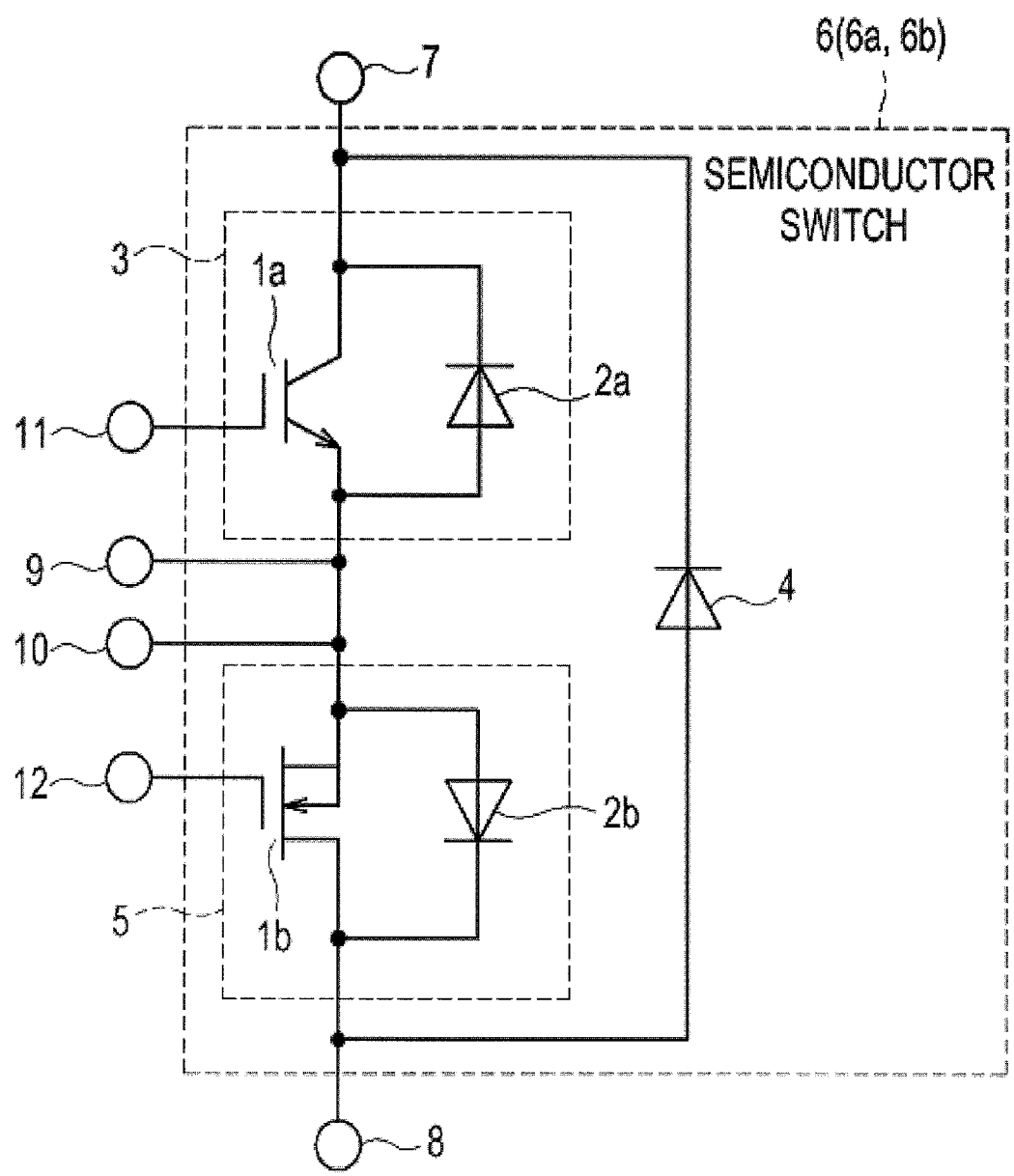
FIG. 1 is a circuit diagram showing a semiconductor switch of a first embodiment.

According to one embodiment, a semiconductor switch includes a main element including a switching element and an anti-parallel diode. The switching element has a high-withstanding voltage and is provided with one control terminal and two main terminals. The semiconductor switch further includes an auxiliary element having a withstanding voltage lower than that of the main element. The auxiliary element is provided with one control terminal and two main terminals. The semiconductor switch further includes a freewheeling diode having a withstanding voltage equivalent to that of the main element. A negative electrode of the main element is connected to a negative electrode of the auxiliary element so that the positive electrode of the main element is used as a positive terminal and the positive electrode of the auxiliary element is used as a negative terminal. Further, the freewheeling diode is connected in parallel between the positive terminal and the negative terminal so that a direction running from the negative terminal toward the positive terminal becomes a forward direction. The semiconductor switch further includes a terminal for on-off control of the main element and the auxiliary element independently of each other.

Certain embodiments will now be described with reference to the accompanying drawings. In the present disclosure, the same or similar circuit components will be described using the same or similar reference characters.

First Embodiment

FIG. 1 shows a semiconductor switch 6a of an upper arm of one bridge circuit in a power conversion device of a first embodiment. Since a semiconductor switch 6b of a lower arm has the same circuit configuration as the semiconductor switch 6a, only the semiconductor switch 6a of the upper arm will be described herein. The general term "semiconductor switch 6" will be used unless there exists a need to distinguish the semiconductor switches 6a and 6b of the upper and lower arms from each other.

The semiconductor switch 6 of the present embodiment includes a main element 3, which is formed of a voltage-driven switching element 1a having a high-withstanding voltage and an anti-parallel diode 2a having a high-withstanding voltage, and an auxiliary element 5, which is formed of a voltage-driven switching element 1b and an anti-parallel diode 2b whose withstanding voltages are respectively lower than that of the main element 3. The negative electrodes of the main element 3 and the auxiliary element 5 are connected to each other. The positive electrode of the main element 3 is connected to a positive terminal 7, while the positive terminal of the auxiliary element 5 is connected to a negative terminal 8. A high-speed freewheeling diode 4 is connected anti-parallel to the serial connection of the main element 3 and the auxiliary element 5. In the semiconductor switch 6 of the present embodiment, the control terminal 11 of the main element 3 and the control terminal 12 of the auxiliary element 5 are separately provided so that the main element 3 and the auxiliary element 5 can be controlled individually. In FIG. 1, reference numeral 9 designates a main-element negative terminal, reference numeral 10 designating an auxiliary-element negative terminal.

Figure 12A:
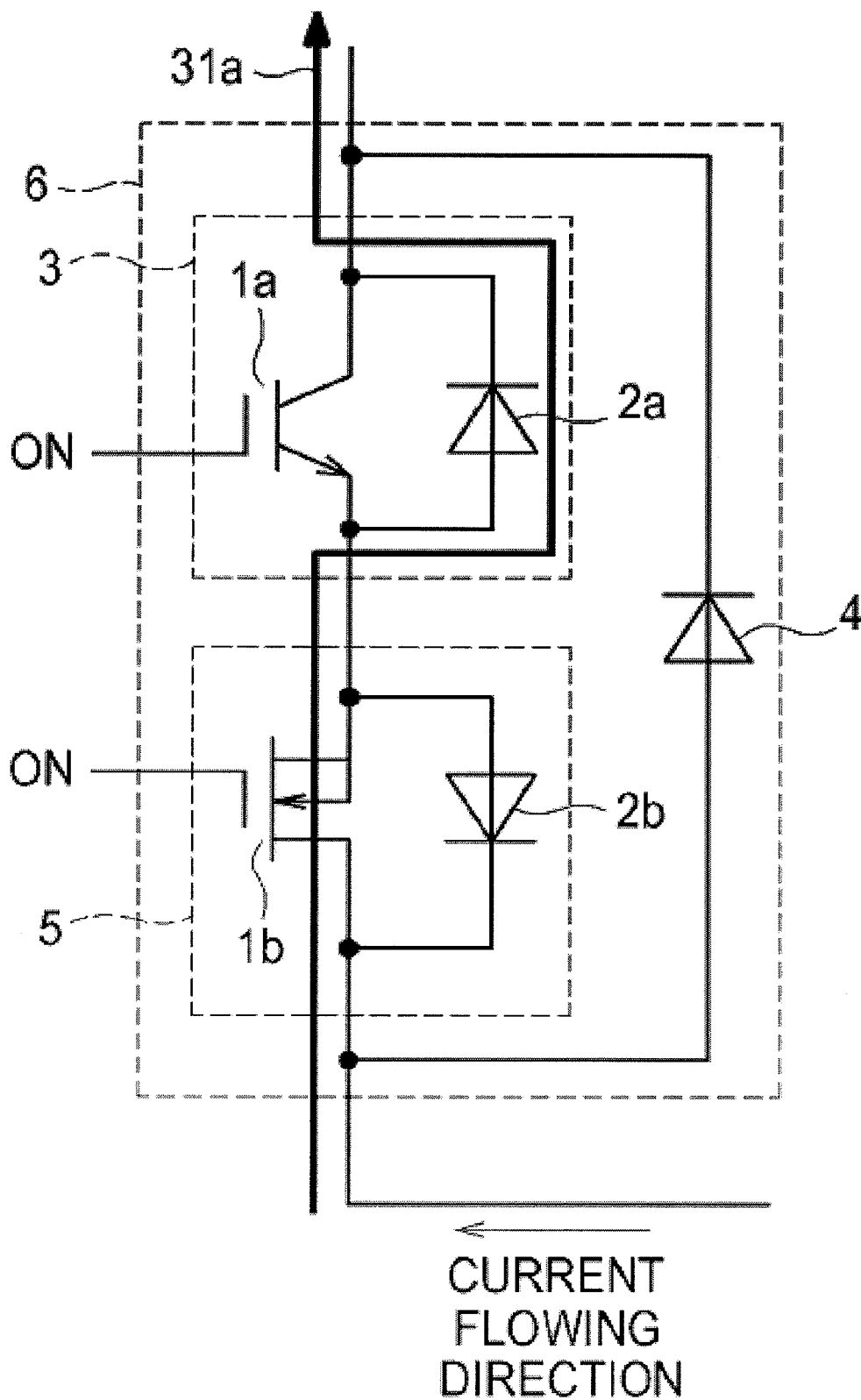
FIG. 12A is a circuit diagram illustrating the flow of an electric current when a main element is turned off and an auxiliary element is turned on in the semiconductor switch of the first embodiment.
Figure 12B:
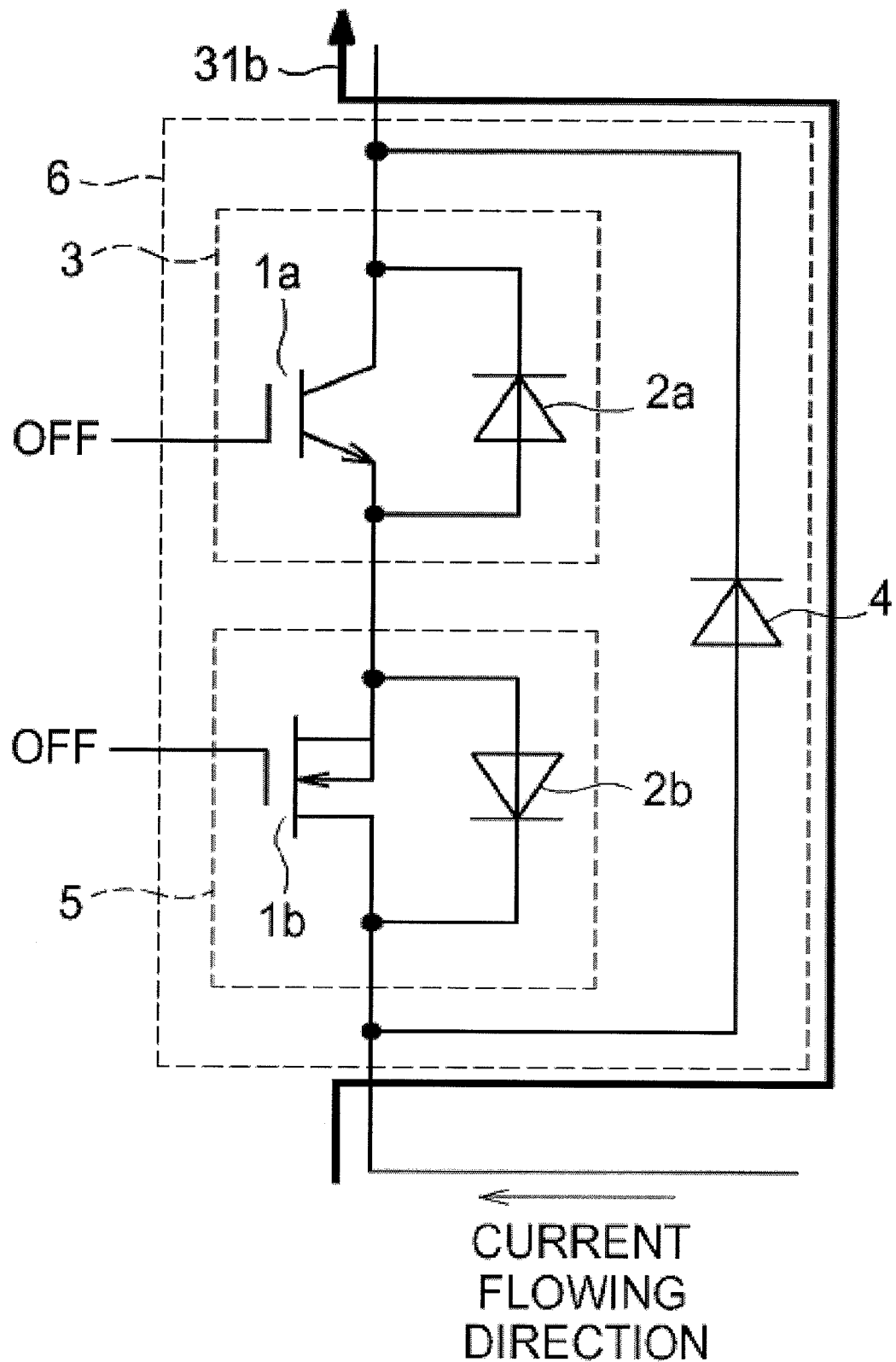
FIG. 12B is a circuit diagram illustrating the flow of an electric current when the main element and the auxiliary element are all turned off.

The semiconductor switch 6 operates as shown in FIGS. 12A and 12B. When a main current flows in the forward direction, namely from the positive terminal 7 toward the negative terminal 8, an on-signal is inputted to the auxiliary element 5 as well as the main element 3. This means that an electric current flows through the voltage-driven switching element 1a of the main element 3 and the voltage-driven switching element of the auxiliary element 5. Even when the main current flows in the backwards direction, namely from the negative terminal 8 toward the positive terminal 7, an on-signal is inputted to the auxiliary element 5. This means that the main current coming from the negative terminal 8 flows toward the positive terminal 7 through the voltage-driven switching element 1b of the auxiliary element 5 and the anti-parallel diode 2a of the main element 3 (see the current flow 31a in FIG. 12A). If the main element 3 is turned off at this time, the auxiliary element 5 is also turned off in synchronism therewith. The current fails to pass the voltage-driven switching element 1b of the auxiliary element 5 and, eventually, is commutated toward the high-speed freewheeling diode 4 (see the current flow 31b in FIG. 12B). With this configuration, in the single-phase equivalent bridge circuit formed of the semiconductor switch 6a of the upper arm and the semiconductor switch 6b of the lower arm, even if one semiconductor switch 6a is turned on, the main current is commutated toward the high-speed freewheeling diode 4 in the other semiconductor switch 6b (remaining in an off-state). This prevents a reverse recovery current from flowing toward the anti-parallel diode 2a, thereby effectively suppressing a reverse recovery phenomenon. During a normal operation, an electric current flows toward the high-speed freewheeling diode 4 only during the time interval between the off-time of one semiconductor switch 6a and the on-time of the other semiconductor switch 6b, i.e., during the dead time interval in the single-phase equivalent bridge circuit. Therefore, the average forward current becomes smaller than the current flowing through the anti-parallel diode 2a. In a typical diode, as an electric current flows therein, a voltage drop (on-voltage) occurs corresponding to the current value, which results in a voltage loss. Since the on-voltage increases in proportion to the flowing current, the loss is increased as the flowing current becomes greater. In a normal operation, therefore, the average forward current of the high-speed freewheeling diode 4 becomes smaller than that of the anti-parallel diode 2a of the main element 3. This means that the loss, i.e., the amount of generated heat, becomes smaller than that generated in the anti-parallel diode 2a of the main element 3.

When a device is abnormally stopped due to causes such as a load current becoming too high or a device temperature increasing to a specified value or more, the device enters a gate-off state if an off-signal is simultaneously inputted to all the switching elements 1a and 1b in both the semiconductor switches 6a and 6b of the upper and lower arms. If the off-signal continues to be inputted to both the switching element 1a of the main element 3 and the switching element 1b of the auxiliary element 5, an electric current may not flow through the auxiliary element 5. For this reason, a main current continues to flow toward the high-speed freewheeling diode 4. Consequently, the average current value is significantly increased as compared with the normal operation in which an electric current flows only during the dead time interval. This is accompanied by a significant increase in the loss, i.e., the amount of heat generated in the high-speed freewheeling diode 4.

On the other hand, the semiconductor switch 6 of the present embodiment is provided with control terminals 11 and 12 for individually applying gate signals to the switching element 1a of the main element 3 and the switching element 1b of the auxiliary element 5. Therefore, if a gate-off state occurs, the circuit configuration of the semiconductor control device 18 of the embodiments described below may perform the control in which the switching element 1b of the auxiliary element 5 remains in an on-state by applying an off-signal to the switching element 1a of the main element 3 while applying an on-signal to the switching element 1b of the auxiliary element 5. By performing such control, the main current flowing from the negative terminal 8 toward the positive terminal 7 passes upwardly through the switching element 1b of the auxiliary element 5 maintained in an on-state and then flows through the anti-parallel diode 2a of the main element 3 in the forward direction. This prevents the high-speed freewheeling diode 4, having a relatively low-withstanding voltage and low capacity formed of a SiC diode in the gate-off state, from being supplied with a high current for a long period of time, which helps protect the high-speed freewheeling diode 4. With such features, it is possible to implement a simpler cooling design of the high-speed freewheeling diode 4.

Second Embodiment

Figure 2:
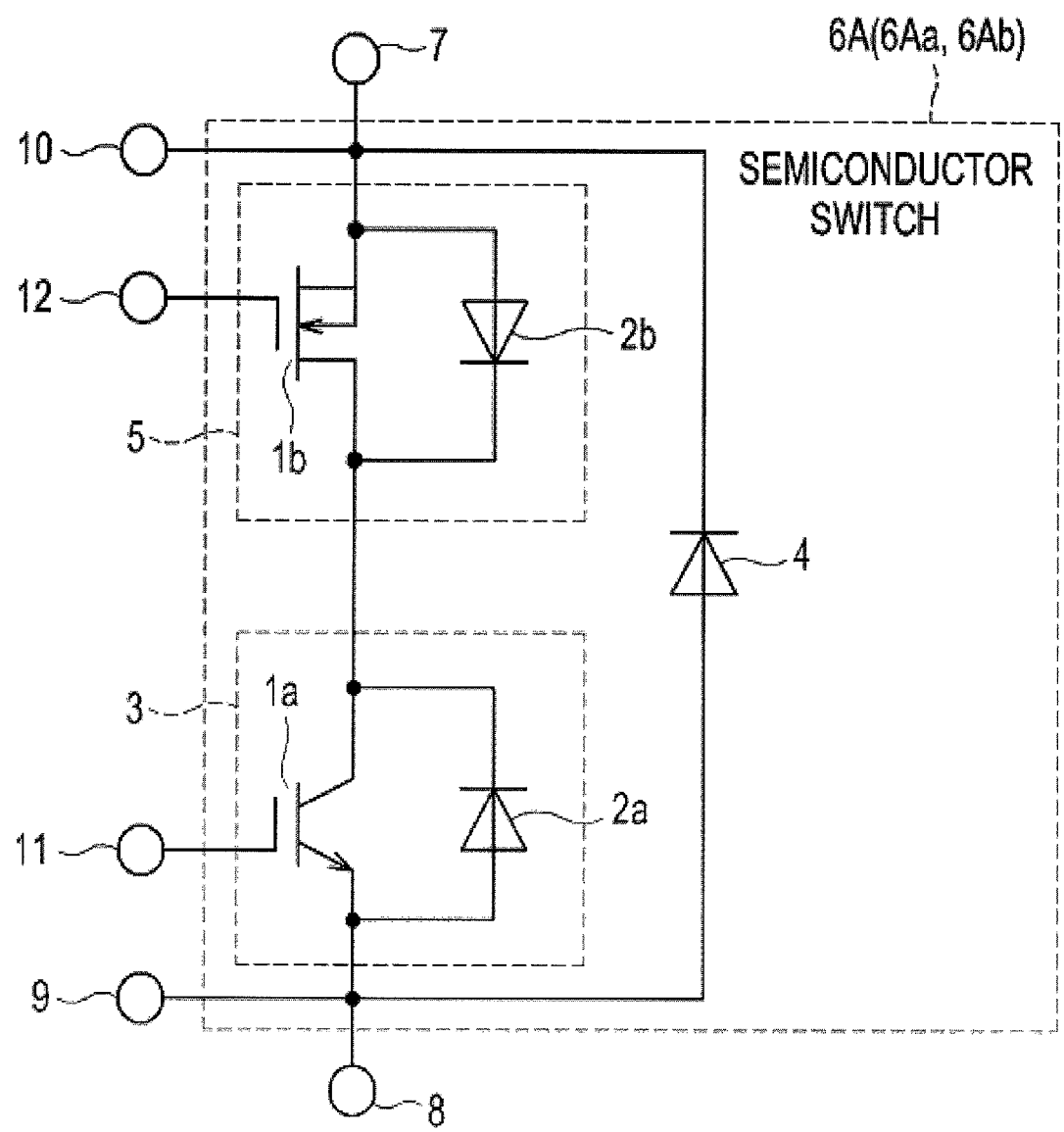
FIG. 2 is a circuit diagram showing a semiconductor switch of a second embodiment.

FIG. 2 shows a semiconductor switch 6A of a second embodiment. The semiconductor switch 6A of the present embodiment differs from the semiconductor switch 6 of the first embodiment shown in FIG. 1 in that the positions of the main element 3 and the auxiliary element 5 are interchanged with each other. The operation principle of the semiconductor switch 6A remains the same as the semiconductor switch 6 of the first embodiment.

Third Embodiment

Figure 3:
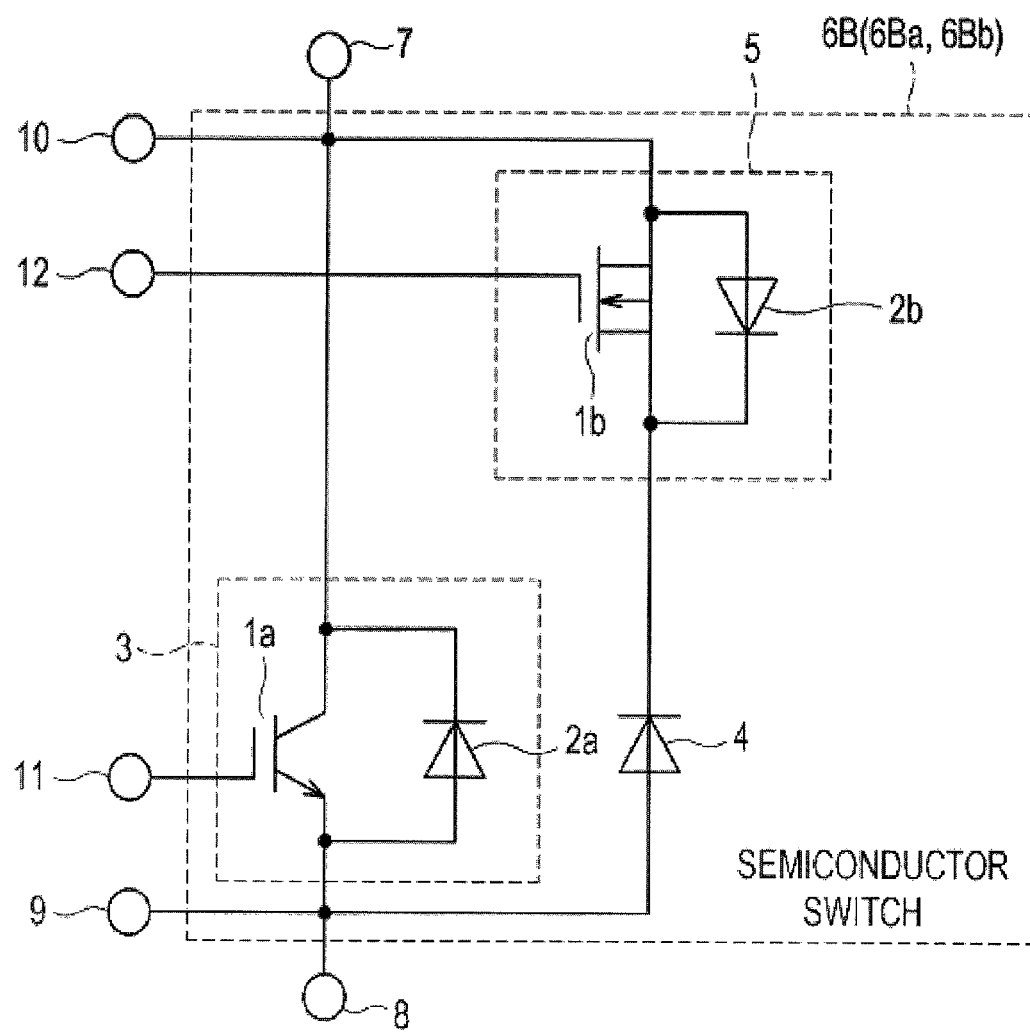
FIG. 3 is a circuit diagram showing a semiconductor switch of a third embodiment.

FIG. 3 shows a semiconductor switch 6B of a third embodiment. The semiconductor switch 6B of the present embodiment has a configuration in which the high-speed freewheeling diode 4 and the auxiliary element 5 are connected in series while the main element 3 is connected in parallel to the serial connection of the high-speed freewheeling diode 4 and the auxiliary element 5.

Since the auxiliary element 5 and the high-speed freewheeling diode 4 are serially connected in the semiconductor switch 6B of the present embodiment, it is possible to feed an electric current to the high-speed freewheeling diode 4 when the auxiliary element 5 is in an on-state. The current flowing route of the high-speed freewheeling diode 4 is interrupted by bringing the auxiliary element 5 into an off-state. In the present embodiment, the control terminal 11 of the main element 3 and the control terminal 12 of the auxiliary element 5 are separately provided, which makes it possible to individually control the main element 3 and the auxiliary element 5. In the present embodiment, however, an electric current is caused to flow through the high-speed freewheeling diode 4 during the dead time interval by turning off the main element 3 and turning on the auxiliary element 5. In the gate-off state, the main element 3 and the auxiliary element 5 are turned off at the same time to feed a main current to the anti-parallel diode 2a of the main element 3. This makes it possible to protect the high-speed freewheeling diode 4.

Fourth Embodiment

Figure 4:
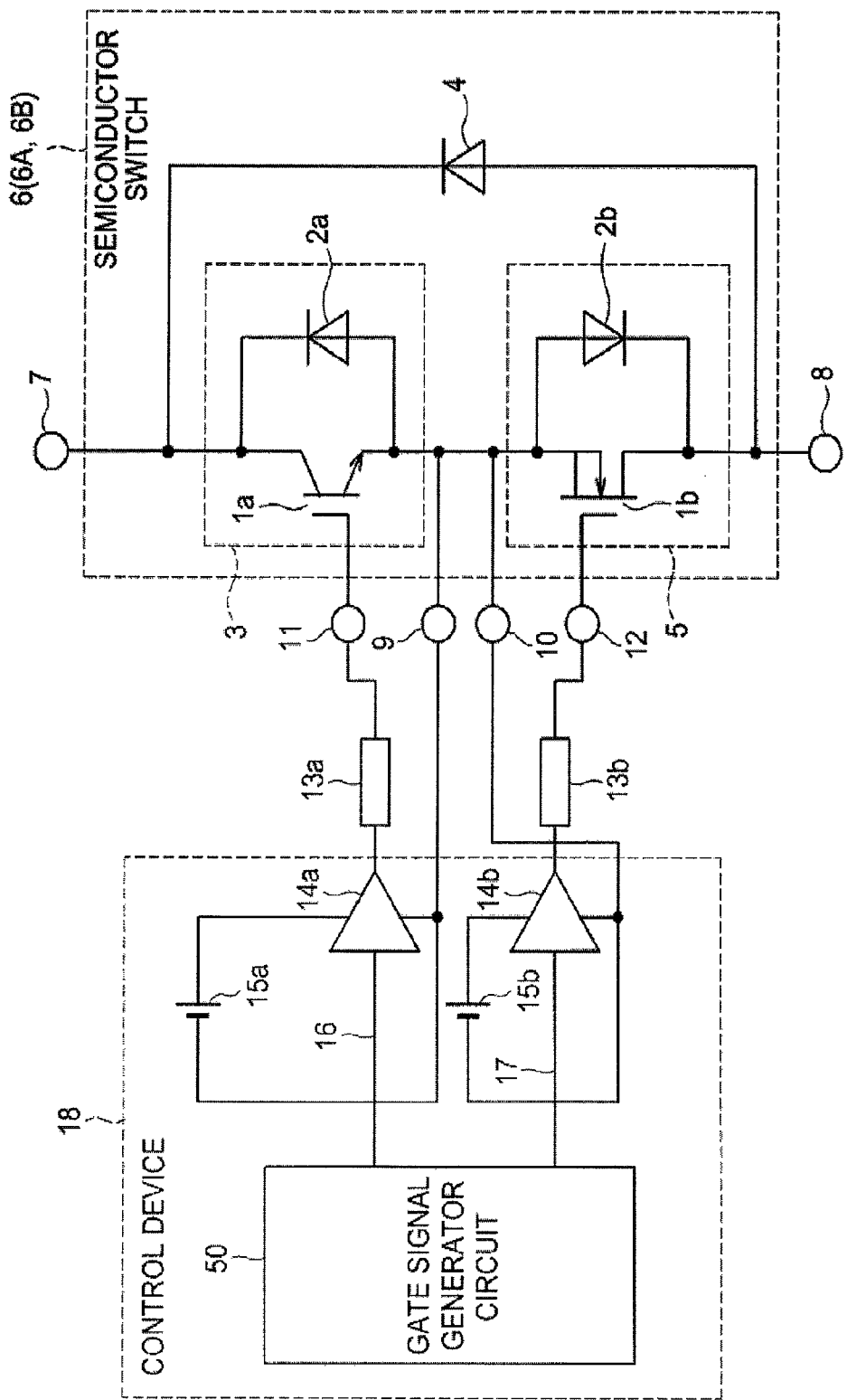
FIG. 4 is a circuit diagram showing a semiconductor switch control device of a fourth embodiment.

FIG. 4 shows a semiconductor switch control device of a fourth embodiment. The semiconductor switch control device 18 of the present embodiment is used in controlling any one of the semiconductor switches 6, 6A and 6B of the first through third embodiments. In the present embodiment, an example case will be described where the semiconductor switch control device 18 controls the semiconductor switch 6 of the first embodiment shown in FIG. 1.

The semiconductor switch control device 18 includes a gate signal generator circuit 50 for separately generating a main-element control signal 16 and an auxiliary-element control signal 17, which are respectively amplified and outputted by voltage amplifier circuits 14a and 14b. The output of the voltage amplifier circuit 14a corresponding to the main element 3 is coupled to a main element control terminal 11 through a resistor 13a. The negative electrode of a voltage amplifier circuit power source 15a corresponding to the main element 3 is connected to the main-element negative terminal 9. On the other hand, the output of the voltage amplifier circuit 14b corresponding to the auxiliary element 5 is coupled to an auxiliary-element control terminal 12 through a resistor 13b. The negative electrode of a voltage amplifier circuit power source 15b corresponding to the auxiliary element 5 is connected to an auxiliary-element negative terminal 10.

In the semiconductor switch control device 18 of the present embodiment, the main-element control signal 16 and the auxiliary-element control signal 17 are generated independently of each other. This makes it possible to control the auxiliary element 5 so that a main current does not continue to flow toward the high-speed freewheeling diode 4 even when the main element 3 is maintained in an off-state due to abnormal stoppage. In other words, if a gate-off state occurs, the semiconductor control device 18 may perform the control in which the switching element 1b of the auxiliary element 5 is maintained in an on-state by applying an off-signal to the control terminal 11 of the switching element 1a of the main element 3 while applying an on-signal to the control terminal 12 of the switching element 1b of the auxiliary element 5. By performing such control, the main current flowing from the negative terminal 8 toward the positive terminal 7 passes upwardly through the switching element 1b of the auxiliary element 5 maintained in an on-state and then flows through the anti-parallel diode 2a of the main element 3 in the forward direction. This prevents the high-speed freewheeling diode 4 of relatively low-withstanding voltage and low capacity formed of a SiC diode in the gate-off state from being supplied with a high current for a long period of time, which helps protect the high-speed freewheeling diode 4. With such features, it is possible to implement a simpler cooling design of the high-speed freewheeling diode 4.

Although the semiconductor switch 6 of the present embodiment shown in FIG. 4 has the same configuration as the semiconductor switch of the first embodiment shown in FIG. 1, the semiconductor switch 6A of the second embodiment shown in FIG. 2 may be employed in place thereof. The control in this case may be performed in the same manner as set forth above. As a further alternative, the semiconductor switch 6B of the third embodiment shown in FIG. 3 may be employed in place of the semiconductor switch 6 shown in FIG. 1. The control in this case may be performed in such a way that, in the gate-off state, the main element 3 and the auxiliary element 5 are simultaneously turned off in a manner contrary to the above so that the main current can flow from the negative terminal 8 toward the positive terminal 7 through the anti-parallel diode 2a.

Fifth Embodiment

Figure 5:
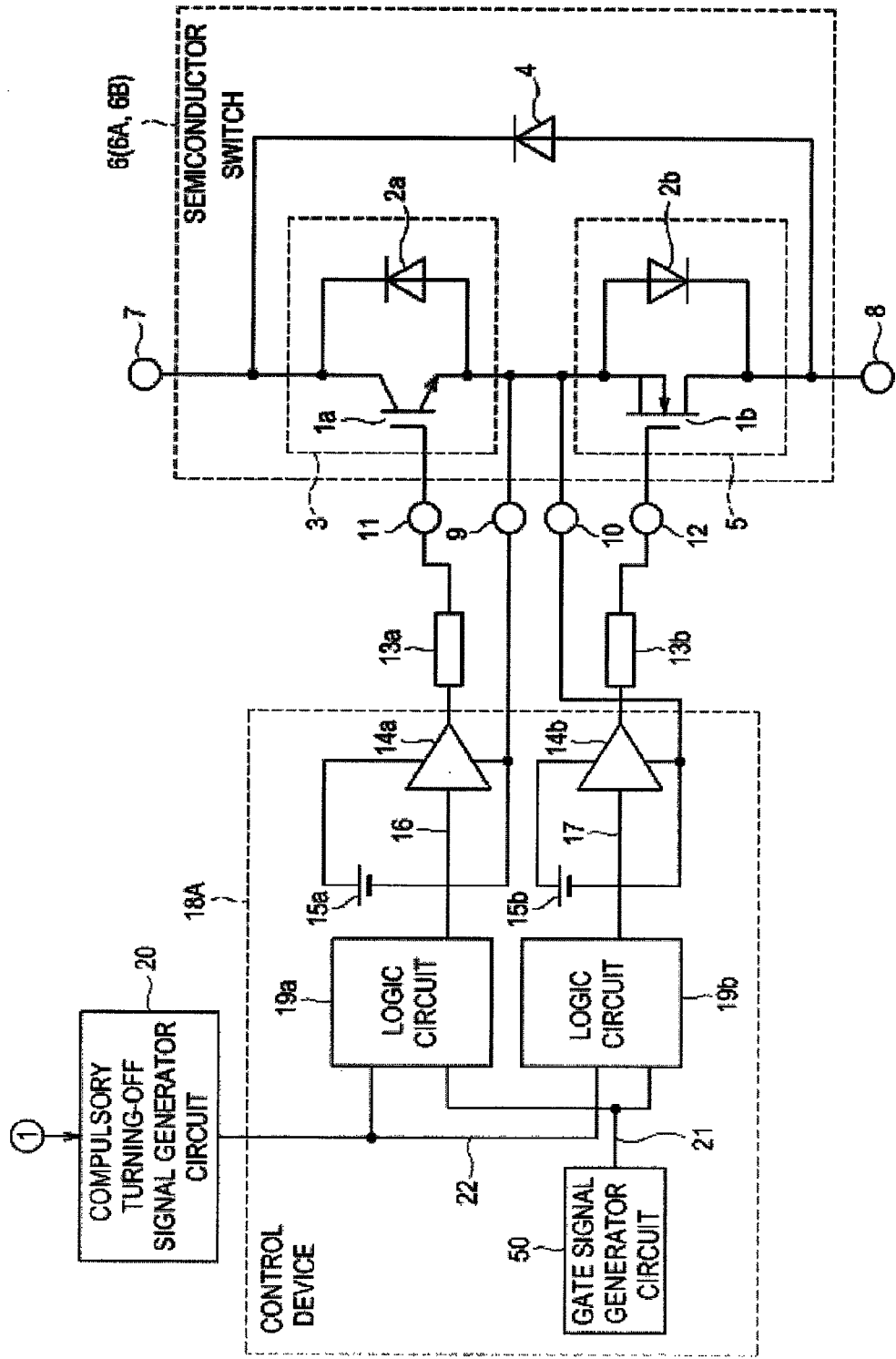
FIG. 5 is a circuit diagram showing a semiconductor switch control device of a fifth embodiment.

FIG. 5 shows a semiconductor switch control device of a fifth embodiment. In addition to the configuration of the control device 18 of the fourth embodiment, the semiconductor switch control device 18A of the present embodiment further includes logic circuits 19a and 19b and a compulsory turning-off signal generator circuit 20.

In a normal state, the semiconductor switch control device 18A of the present embodiment allows the gate signal generator circuit 50 to output a common control signal 21 to the logic circuits 19a and 19b. When a compulsory turning-off signal is not inputted from the compulsory turning-off signal generator circuit 20 in the normal state, the logic circuits 19a and 19b serve to output a common control signal 21 to the main-element control signal 16 and the auxiliary-element control signal 17. On the other hand, if the load current detected by a current detector CT becomes excessively great and if there is an abnormal condition in which the temperature of a device exceeds a specified value, the compulsory turning-off signal generator circuit 20 outputs a compulsory turning-off signal 22 to enable the logic circuit 19a to turn off the main element 3. At the same time, the logic circuit 19b applies an on-signal to the main element 5 so that the main current can flow from the negative terminal 8 to the positive terminal 7 through the auxiliary element 5 and the anti-parallel diode 2a of the main element 3.

In the semiconductor switch control device 18A of the present embodiment, the above-described function ensures that no current flows toward the high-speed freewheeling diode 4 when a device is abnormally stopped. This makes it possible to reduce the current sharing of the high-speed freewheeling diode 4.

In the present embodiment, this prevents the high-speed freewheeling diode 4 of relatively low-withstanding voltage and low capacity formed of a SiC diode in the gate-off state from being supplied with a high current for a long period of time, which helps protect the high-speed freewheeling diode 4. With such features, it is possible to implement a simpler cooling design of the high-speed freewheeling diode 4.

Although the semiconductor switch 6 of the present embodiment shown in FIG. 5 has the same configuration as the semiconductor switch of the first embodiment shown in FIG. 1, the semiconductor switch 6A of the second embodiment shown in FIG. 2 may be employed in place thereof. The control in this case may be performed in the same manner as set forth above. As a further alternative, the semiconductor switch 6B of the third embodiment shown in FIG. 3 may be employed in place of the semiconductor switch 6 shown in FIG. 1. The control in this case may be performed in such a way that the main element 3 and the auxiliary element 5 are simultaneously turned off in the gate-off state so that the main current can flow from the negative terminal 8 toward the positive terminal 7 through the anti-parallel diode 2a.

In the present embodiment, a steep temperature rise may be seen in the load output if a load current is abnormally increased. In view of this, a temperature sensor may be installed in place of the current detector CT so that the compulsory turning-off signal generator circuit 20 can output a compulsory turning-off signal 22 based on a temperature detection signal.

Sixth Embodiment

Figure 6:
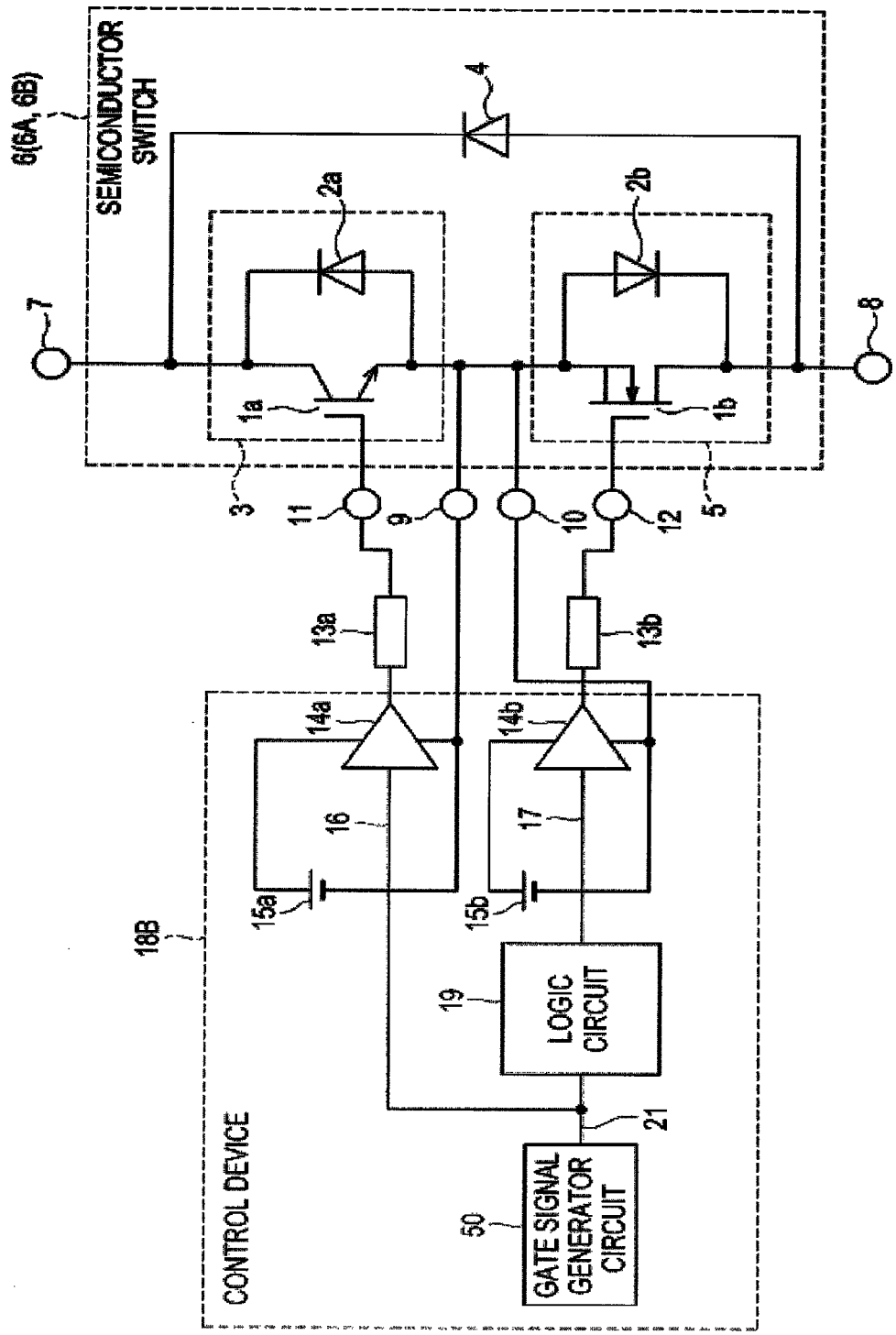
FIG. 6 is a circuit diagram showing a semiconductor switch control device of a sixth embodiment.

FIG. 6 shows a semiconductor switch control device of a sixth embodiment. In addition to the configuration of the control device 18 of the fourth embodiment, the semiconductor switch control device 18B of the present embodiment includes a logic circuit 19 installed at the auxiliary-element control side. The gate control signal 21 generated from the gate signal generator circuit 50 is directly applied to a main-element voltage amplifier 14a. At the same time, an auxiliary-element control signal 17 is generated by allowing the gate control signal 21 to pass through the logic circuit 19. The auxiliary-element control signal 17 is applied to an auxiliary-element voltage amplifier 14b.

In the semiconductor switch control device 18B of the present embodiment, the gate control signal 21, which is coupled to the main-element control signal 16, is inputted to the logic circuit 19. The logic circuit 19 in some embodiments feeds an electric current to the high-speed freewheeling diode 4 only during the interval equivalent to the dead time interval (i.e., the time interval between the off-time of one semiconductor switch 6a and the on-time of the other semiconductor switch 6b in the single-phase equivalent bridge circuit) counted from the moment when the main-element control signal 16 becomes an off-output, so that the auxiliary-element control signal 17 is outputted. In a time period other than the above interval, the auxiliary element 5 is maintained in an on-state.

In the semiconductor switch control device 18B of the present embodiment, therefore, it is possible to feed an electric current to the anti-parallel diode 2a of the main element 3 in a time period other than the above interval equivalent to the dead time interval. This makes it possible to reduce the current sharing of the high-speed freewheeling diode 4. Similar to the fourth embodiment, this prevents the high-speed freewheeling diode 4 of relatively low-withstanding voltage and low capacity formed of a SiC diode in the gate-off state from being supplied with a high current for a long period of time, which helps protect the high-speed freewheeling diode 4. With such features, it is possible to implement a simpler cooling design of the high-speed freewheeling diode 4.

Although the semiconductor switch 6 of the present embodiment shown in FIG. 6 has the same configuration as the semiconductor switch of the first embodiment shown in FIG. 1, the semiconductor switch 6A of the second embodiment shown in FIG. 2 may be employed in place thereof. The control in this case may be performed in the same manner as set forth above. As a further alternative, the semiconductor switch 6B of the third embodiment shown in FIG. 3 may be employed in place of the semiconductor switch 6 shown in FIG. 1. The control in this case may be performed in such a way that, in the gate-off state, the main element 3 and the auxiliary element 5 are simultaneously turned off so that the main current can flow from the negative terminal 8 toward the positive terminal 7 through the anti-parallel diode 2a.

Seventh Embodiment

Figure 7:
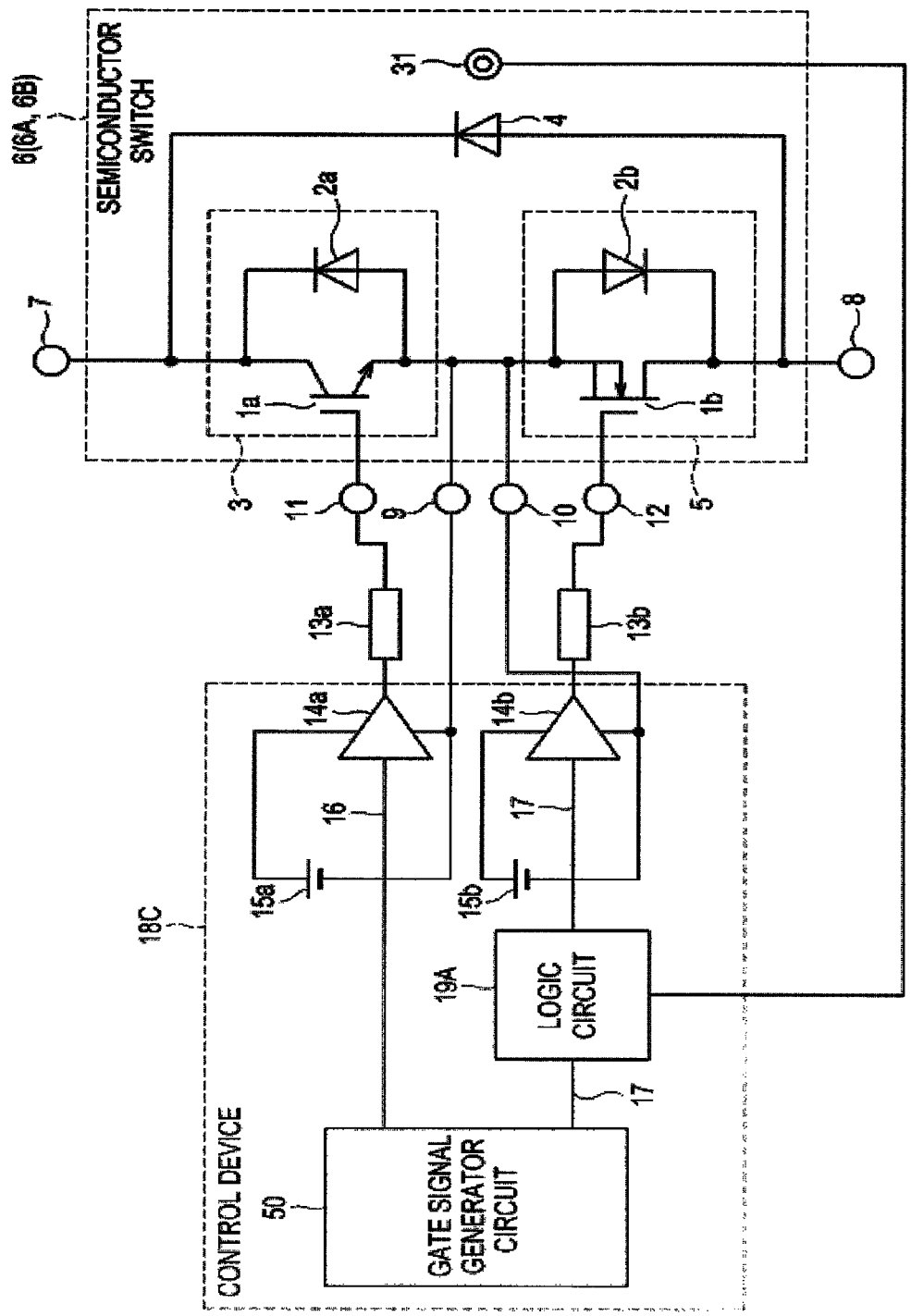
FIG. 7 is a circuit diagram showing a semiconductor switch control device of a seventh embodiment.

FIG. 7 shows a semiconductor switch control device of a seventh embodiment. The semiconductor switch control device 18C of the present embodiment differs from the semiconductor switch control device 18 of the fourth embodiment in that the gate signal generator circuit 50 separately outputs gate control signals 16 and 17. A logic circuit 19A is involved in controlling the auxiliary-element in such a way that the output of the logic circuit 19A is used as an auxiliary-element control signal 17'. Further, a temperature detector 31 for detecting the temperature of the high-speed freewheeling diode 4 is provided to input a temperature detection signal to the logic circuit 19A.

In the semiconductor switch control device 18C of the present embodiment, the gate control signals 16 and 17 of the gate signal generator circuit 50 are directly inputted during normal operation time to the control terminals 11 and 12 of the semiconductor switch 6 as a main-element control signal 16 and an auxiliary-element control signal 17'. In a gate-off state, the semiconductor switch control device 18C operates in the same manner as set forth in the fourth embodiment.

If the temperature of the high-speed freewheeling diode 4 is increased and if the temperature value detected by the temperature detector 31 exceeds a specified temperature value, the logic circuit 19A outputs an auxiliary-element control signal 17' to keep an electric current from flowing toward the high-speed freewheeling diode 4. In other words, the logic circuit 19A outputs an auxiliary-element control signal 17' by which the auxiliary element 5 enters an on-state. With such features, in addition to the advantageous effects provided by the fourth embodiment, the present embodiment provides protecting the high-speed freewheeling diode 4 in a gate-off state while preventing the high-speed freewheeling diode 4 from overheating even when the temperature thereof is abnormally increased due to certain causes.

Eighth Embodiment

Figure 8:
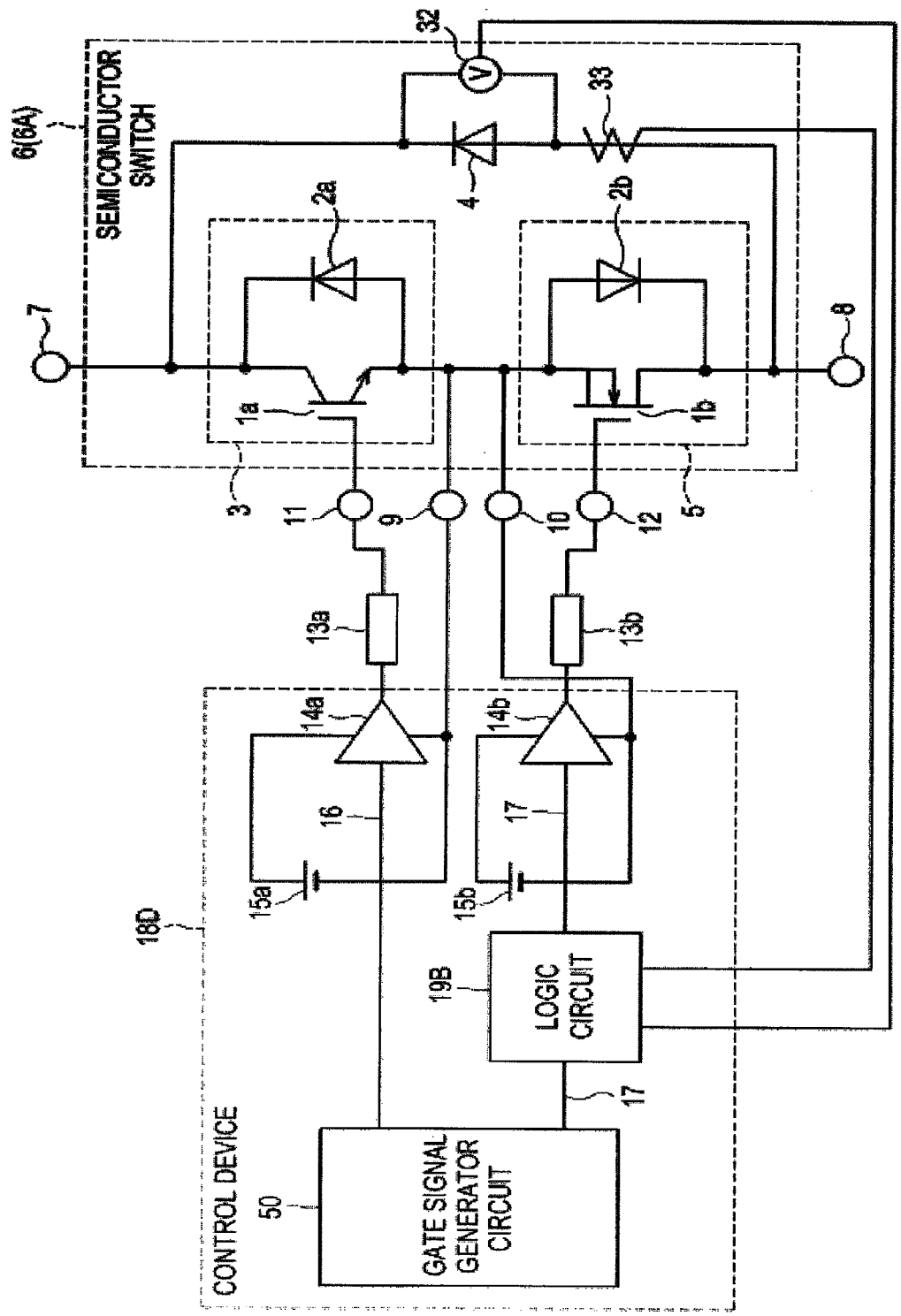
FIG. 8 is a circuit diagram showing a semiconductor switch control device of an eighth embodiment.

FIG. 8 shows a semiconductor switch control device of an eighth embodiment. The semiconductor switch control device 18D of the present embodiment is configured to provide, in place of the temperature detector 31 of the seventh embodiment shown in FIG. 7, a voltage detector 32 for detecting the voltage of an electric current flowing through the high-speed freewheeling diode 4 and a current detector 33 for detecting the electric current, by which the detection signals of the voltage detector 32 and the current detector 33 are inputted to the logic circuit 19B.

In the semiconductor switch control device 18D of the present embodiment, the on/off control of the main element 3 and the auxiliary element 5 during a normal time as well as during a gate-off time can be performed in the same manner as set forth in the fourth embodiment. Additionally, the semiconductor switch control device 18D performs the following protection operation.

If the high-speed freewheeling diode 4 suffers from open failure in a power conversion device employing the semiconductor switch 6 of the first embodiment or the semiconductor switch 6A of the second embodiment, the current flowing route in a freewheeling mode (or a rectifying mode) disappears if the auxiliary element 5 is in an off-state. Thus, in the present embodiment, the voltage and the current of the high-speed freewheeling diode 4 are detected by the voltage detector 32 and the current detector 33, respectively. Based on the detected voltage and current values, the logic circuit 19B determines whether the open failure has occurred in the high-speed freewheeling diode 4. When it is determined that an open failure has occurred, the auxiliary element 5 is maintained in an on-state to thereby secure a current flowing route.

The logic circuit 19B determines whether an open failure has occurred, as follows. Due to the characteristics of a diode, in normal operation, an electric current is allowed to flow when a forward voltage is applied to the diode. On the other hand, when an open failure occurs, no current flows even when the forward current is applied to the diode. Thus, in the present embodiment, the forward voltage is detected based on the detection signals of the voltage detector 32 and the current detector 33. If the current value becomes zero, it is determined that the high-speed freewheeling diode 4 has undergone an open failure.

In the semiconductor switch control device 18D of the present embodiment, the occurrence of an open failure in the high-speed freewheeling diode 4 is determined using the voltage value and the current value detected by the voltage detector 32 and the current detector 33. If it is determined that an open failure has occurred, the auxiliary element 5 is maintained in an on-state to thereby secure a current flowing route.

Ninth Embodiment

Figure 9:
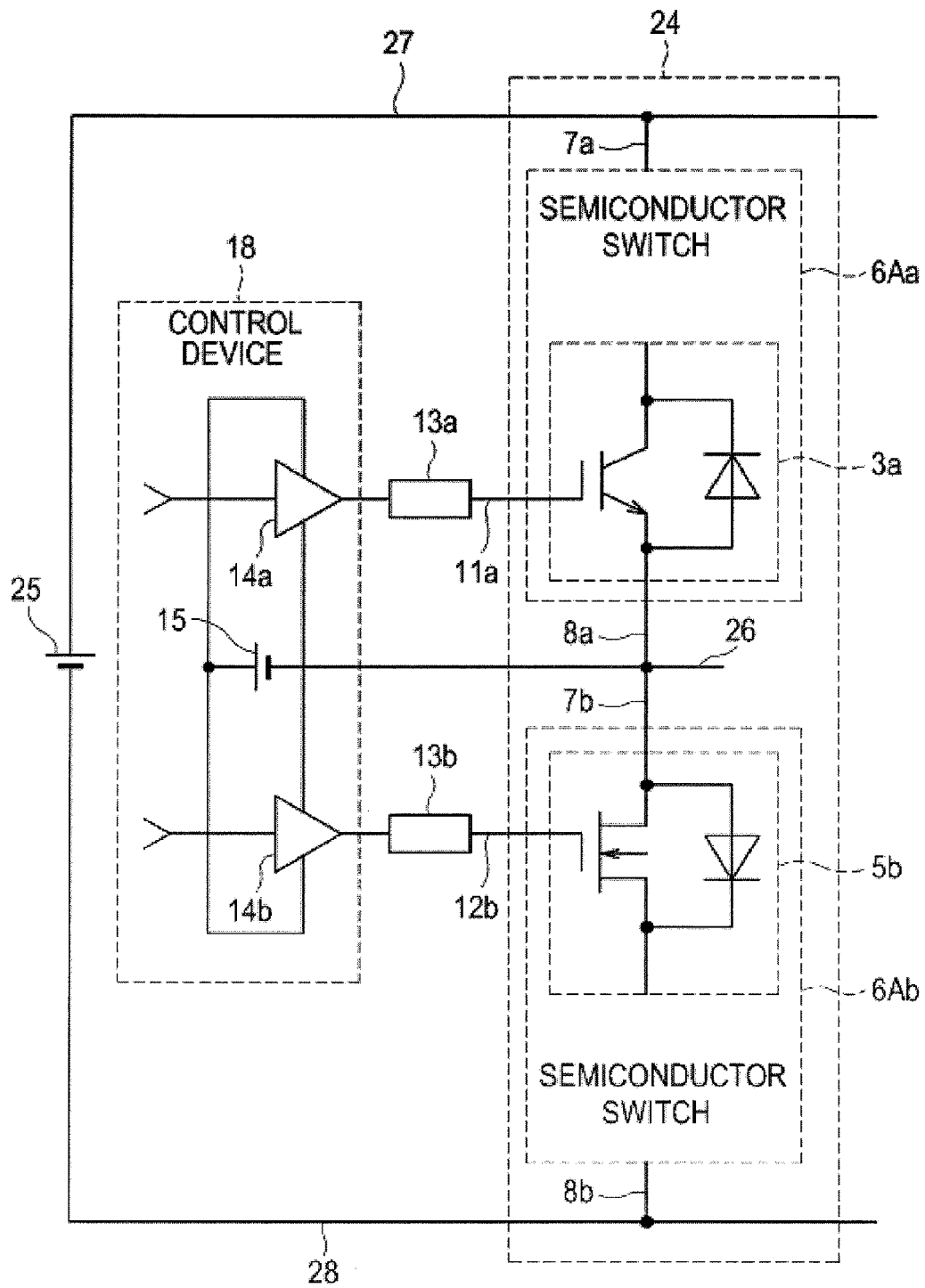
FIG. 9 is a circuit diagram showing a power conversion device of a ninth embodiment.

FIG. 9 shows a power conversion device of a ninth embodiment. The power conversion device of the present embodiment includes one or more phases of bridge circuits 24 respectively formed by serially connecting two semiconductor switches 6A or 6B of the second or third embodiment. In the power conversion device, the power source for the voltage amplifier circuit 14a of the main element 3a of the semiconductor switch 6Aa (connected to a positive-terminal direct-current bus bar 27) and the power source for the voltage amplifier circuit 14b of the auxiliary element 5b of the semiconductor switch 6Ab (connected to a negative-terminal direct-current bus bar 28) are designed to share a single power source 15.

In case of using the semiconductor switch 6A of the second embodiment, the bridge circuit 24 can be formed by serially connecting the upper and lower semiconductor switches 6Aa and 6Ab. In case of using the semiconductor switch 6B of the third embodiment, the bridge circuit 24 can be formed by serially connecting the upper and lower semiconductor switches 6Ba and 6Bb. Reference character 7a designates an upper positive terminal while reference character 7b designates a lower positive terminal. Reference character 8a designates an upper negative terminal while reference character 8b designates a lower negative terminal. Reference character 25 designates a main power source.

For the sake of simplified illustration, FIG. 9 shows only the main element 3a with respect to the semiconductor switch 6Aa of the upper arm of the bridge circuit 24 while omitting the auxiliary element 5a from illustration. With respect to the semiconductor switch 6Ab of the lower arm of the bridge circuit 24, FIG. 9 shows only the auxiliary element 5b while omitting the main element 3b from illustration.

In the power conversion device of the present embodiment, the normal gate control operation and the operation in the gate-off state are performed in the same manner as the semiconductor switch control devices of the fourth through sixth embodiments, thereby providing the same effects as provided in the fourth through sixth embodiments. In the power conversion device of the present embodiment, it is possible to simplify the circuitry by commonly using the voltage amplifier circuit power source 15 with respect to the control signals 16 and 17 of the main element 3 and the auxiliary element 5.

Tenth Embodiment

Figure 10:
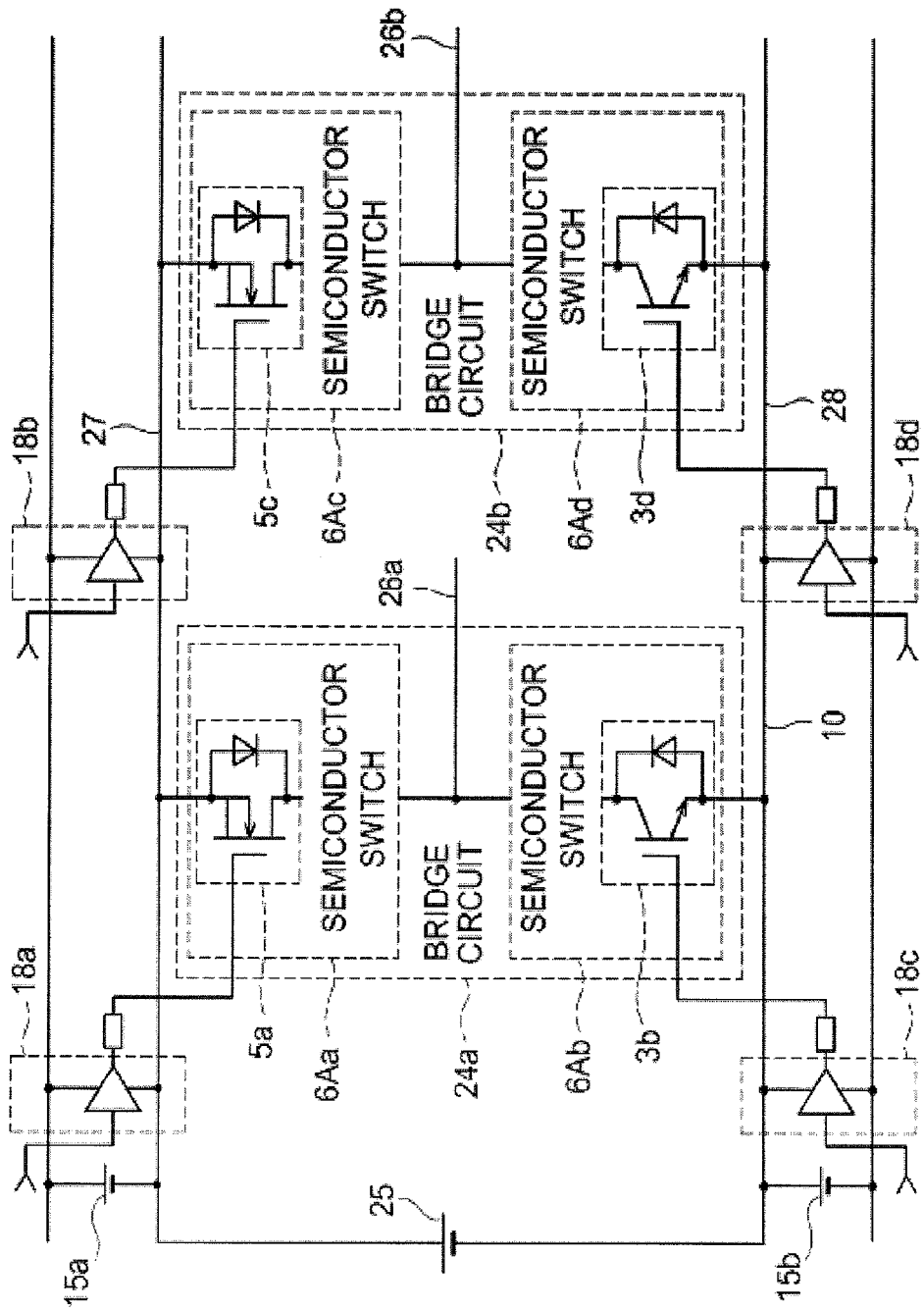
FIG. 10 is a circuit diagram showing a power conversion device of a tenth embodiment.

FIG. 10 shows a power conversion device of a tenth embodiment. The power conversion device of the present embodiment includes two or more phases of bridge circuits 24a and 24b respectively formed by serially connecting two semiconductor switches 6A or 6B of the second or third embodiment. In the power conversion device, the power source 15a is commonly used for the voltage amplifier circuits of the auxiliary elements 5a and 5c of the semiconductor switches 6Aa and 6Ac respectively, which are connected to the positive-terminal direct-current bus bar 27. Also, the power source 15b is commonly used for the voltage amplifier circuits of the main elements 3b and 3d of the semiconductor switches 6Ab and 6Ad respectively, which are connected to the negative-terminal direct-current bus bar 28.

In case of using the semiconductor switch 6A of the second embodiment, the first bridge circuit 24 formed by serially connecting the upper and lower semiconductor switches 6Aa and 6Ab is indicated as a bridge circuit 24a, while the other bridge circuit 24 formed by serially connecting the upper and lower semiconductor switches 6Ac and 6Ad is indicated as a bridge circuit 24b. Alternatively, in case of using the semiconductor switch 6B of the third embodiment, two phases of bridge circuits 24, both of which are formed by serially connecting the upper and lower semiconductor switches 6Ba and 6Bb, are connected in parallel to provide the bridge circuits 24a and 24b. In the semiconductor switches 6Aa, 6Ab, 6Ac and 6Ad, the main elements 3 are respectively indicated as main elements 3a, 3b, 3c and 3d. Also, the auxiliary elements 5 are respectively indicated as main elements 5a, 5b, 5c and 5d. The control devices for controlling the semiconductor switches 6Aa and 6Ac are respectively indicated as control devices 18a and 18b. The control devices for controlling the semiconductor switches 6Ab and 6Ad are respectively indicated as control devices 18c and 18d. Reference characters 26a and 26b designate output terminals.

For the sake of simplified illustration, FIG. 10 shows only the auxiliary element 5a with respect to the semiconductor switch 6Aa of the upper arm of the left first-phase bridge circuit 24a while omitting the main element 3a from illustration. With respect to the semiconductor switch 6Ab of the lower arm, FIG. 10 shows only the main element 3b while omitting the auxiliary element 5b from illustration. Further, with respect to semiconductor switch 6Ac of the upper arm of the right second-phase bridge circuit 24b, FIG. 10 shows only the auxiliary element 5c while omitting the main element 3c from illustration. With respect to the semiconductor switch 6Ad of the lower arm, FIG. 10 shows only the main element 3d while omitting the auxiliary element 5d from illustration.

In the power conversion device of the present embodiment, the normal gate control operation and the operation in the gate-off state are performed in the same manner as the semiconductor switch control devices of the fourth through sixth embodiments, thereby providing the same effects as provided in the fourth through sixth embodiments. In the power conversion device of the present embodiment, it is possible to simplify the circuitry by commonly using the voltage amplifier circuit power sources 15a and 15b in the same manner as provided in the power conversion device of the ninth embodiment.

Eleventh Embodiment

Figures 11A, 11B:
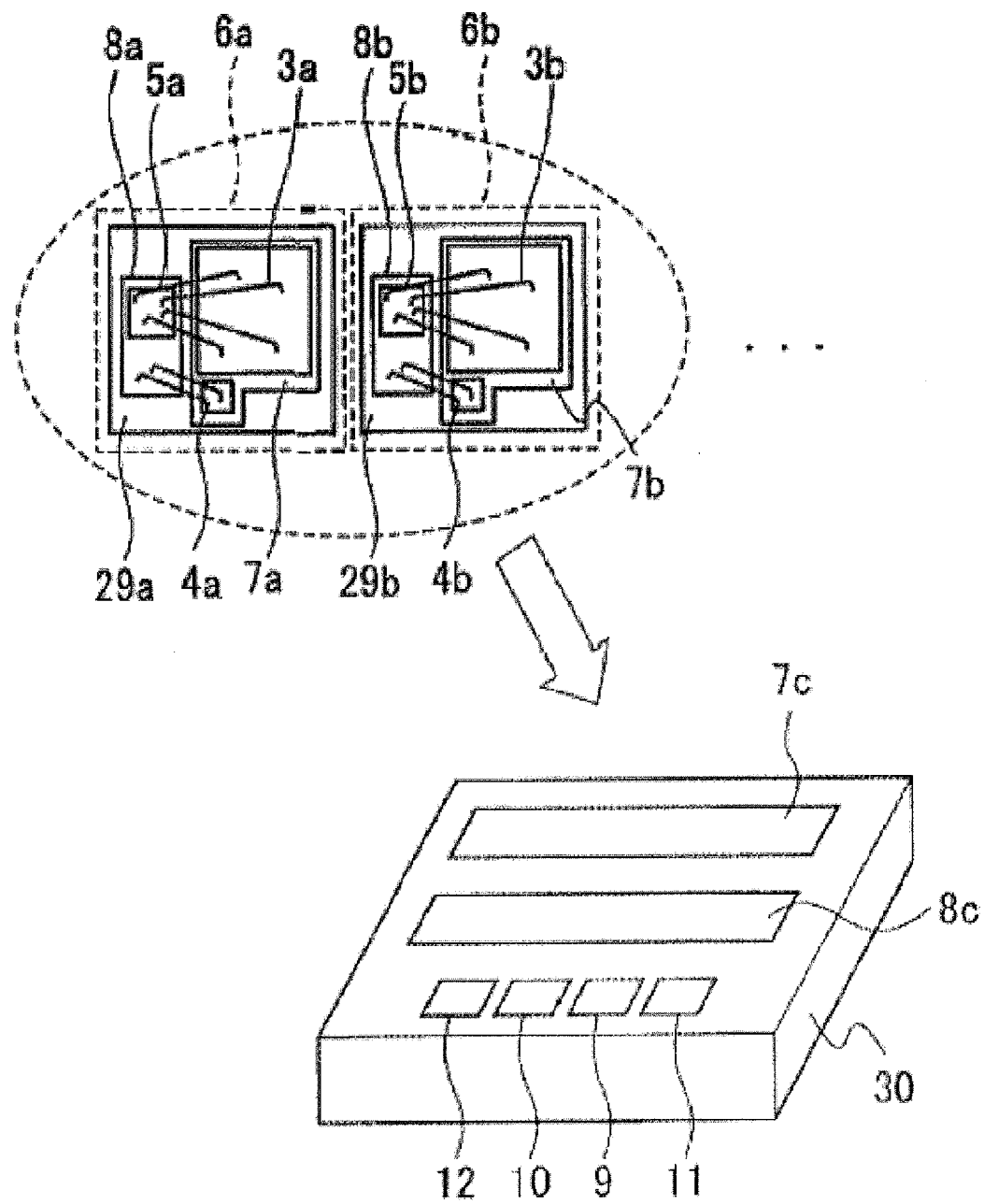
FIG. 11A illustrates a plan and a perspective view showing a power conversion circuit element of an eleventh embodiment.
FIG. 11B illustrates the surface of the modularized element of a power conversion circuit of an eleventh embodiment.

FIGS. 11A and 11B show a power conversion circuit element of an eleventh embodiment whose feature resides in modularization. In the power conversion circuit element of the present embodiment, the semiconductor chips including the main element 3a, the freewheeling diode 4a and the auxiliary element 5a are placed on a single substrate 29a to provide the semiconductor switch 6a. Further, the semiconductor chips of the main element 3b, the freewheeling diode 4b and the auxiliary element 5b are placed on a single substrate 29b to provide the semiconductor switch 6b. Then, a modularized element is formed by putting the substrates 29a and 29b into a single package 30.

In the power conversion circuit element of the present embodiment, the terminals of the semiconductor chips having the same polarity are connected to one another by a conductor such as a bonding wire or the like. On the surface of the modularized element, the following are provided: a positive terminal 7c, a negative terminal 8c, a main-element control terminal 11, an auxiliary-element control terminal 12, a main-element negative terminal 9 and an auxiliary-element negative terminal 10. The main-element control terminal 11, the auxiliary-element control terminal 12, the main-element negative terminal 9 and the auxiliary-element negative terminal 10 are used to input the control signals for driving the main element 3 and the auxiliary element 5. It is possible to simplify the circuitry and to reduce the circuit inductance by forming the power conversion device into a modularized element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the sprit of the inventions. The accompanying claims and their equivalents are intended to cover such forms or modifications as would fall within the scope and sprit of the inventions.

What is claimed is:

1. A power conversion device, comprising:
   at least one bridge circuit having a first semiconductor switch and a second semiconductor switch connected to the first semiconductor switch in series, wherein
   the first semiconductor switch has a first element which includes a first switching element having a first given breakdown voltage and a first anti-parallel diode, a second element, connected to the first element in series, which includes a second switching element having a breakdown voltage lower than the first given breakdown voltage and a second anti-parallel diode, and a first freewheel diode, having a breakdown voltage equivalent to the first given breakdown voltage, connected to the first and the second elements in parallel,
   the second semiconductor switch has a third element which includes a third switching element having a second given breakdown voltage and a third anti-parallel diode, a fourth element, connected to the third element in series, which includes a fourth switching element having a breakdown voltage lower than the second given breakdown voltage and a fourth anti-parallel diode, and a second freewheel diode, having a breakdown voltage equivalent to the second given breakdown voltage, connected to the third and the fourth elements in parallel; and
   a controller which controls the first and second semiconductor switches so that an electric current flows through the first and the second freewheel diodes during a time duration between switching off one of the first and the second semiconductor switches and switching on the other one of the first and the second semiconductor switches.

2. The power conversion device according to claim 1, wherein the controller outputs, when an abnormal condition is detected, a first signal for compulsorily turning off the first element and controls the second element so that an electric current does not flow through the first freewheel diode, and outputs, when the abnormal condition is detected, a second signal for turning off the third element and controls the fourth element so that an electric current does not flow through the second freewheel diode.

3. The power conversion device according to claim 1, wherein the controller switches the second element on so that the electric current does not flow through the first freewheel diode after the time duration, between switching off the first semiconductor switch and switching on the second semiconductor switch, is elapsed, and switches the fourth element on so that the electric current does not flow through the second freewheel diode after the time duration, between switching off the second semiconductor switch and switching on the first semiconductor switch, is elapsed.

4. The power conversion device according to claim 1, further comprising a first temperature detector and a second temperature detector for detecting a temperature of the first and second freewheel diodes respectively,
   wherein the controller controls the first semiconductor switch and the second semiconductor switch so that the electric current does not flow through the first and second freewheel diodes when the detected temperature by the first and second temperature detector exceeds a predetermined value.

5. The power conversion device switch according to claim 1, further comprising a first voltage detector for detecting a voltage of the first freewheel diode, a second voltage detector for detecting a voltage of the second freewheel diode, a first current detector for detecting an electric current flowing through the first freewheel diode, and a second current detector for detecting an electric current flowing through the second freewheel diode,
   wherein the controller determines whether a failure has occurred in the first and second freewheel diodes based on the detected voltage value and the detected current value and controls the second element and fourth element to maintain an on state in case a failure has occurred.

6. The power conversion device according to claim 1, wherein a negative side of the first element faces with a negative side of the second element, and a negative side of the third element faces with a negative side of the fourth element.

7. The power conversion device according to claim 1, wherein the controller outputs an instruction to the second switching element and the fourth switching element to switch from an off state into an on state when the time duration finishes.

* * * * *